(12) United States Patent
Wang

(10) Patent No.: US 10,978,377 B2
(45) Date of Patent: Apr. 13, 2021

(54) SEMICONDUCTOR CHIP SET WITH DOUBLE-SIDED OFF-CHIP BONDING STRUCTURE

(71) Applicant: Gyh-Bin Wang, Hsinchu County (TW)

(72) Inventor: Gyh-Bin Wang, Hsinchu County (TW)

( * ) Notice: Subject to any disclaimer, the term of this patent is extended or adjusted under 35 U.S.C. 154(b) by 0 days.

(21) Appl. No.: 16/732,771

(22) Filed: Jan. 2, 2020

(65) Prior Publication Data

US 2020/0211930 A1  Jul. 2, 2020

Related U.S. Application Data

(60) Provisional application No. 62/787,727, filed on Jan. 2, 2019.

(51) Int. Cl.
*H01L 23/48* (2006.01)
*H01L 25/065* (2006.01)
*H01L 23/00* (2006.01)

(52) U.S. Cl.
CPC ............ *H01L 23/481* (2013.01); *H01L 24/13* (2013.01); *H01L 24/45* (2013.01); *H01L 24/73* (2013.01); *H01L 25/0657* (2013.01); *H01L 2225/06541* (2013.01)

(58) Field of Classification Search
CPC ........ H01L 23/481; H01L 24/13; H01L 24/45
See application file for complete search history.

(56) References Cited

U.S. PATENT DOCUMENTS

2014/0175673 A1* 6/2014 Kim .................. H01L 24/73
257/777

* cited by examiner

*Primary Examiner* — Errol V Fernandes
(74) *Attorney, Agent, or Firm* — WPAT, PC

(57) ABSTRACT

A semiconductor chip set with double-sided off-chip bonding structure in the disclosure comprises at least one first off-chip bonding structure formed above a first surface of the semiconductor chip set, and at least one second off-chip bonding structure formed above a second surface of the semiconductor chip set, wherein the first surface is opposite to the second surface and each of the first off-chip bonding structure and the second off-chip bonding structure is used for connecting to an electrical connecting point external to the semiconductor chip set through bonding wire, through-silicon via (TSV) or micro bump.

10 Claims, 5 Drawing Sheets

SEMICONDUCTOR CHIP SET WITH DOUBLE-SIDED OFF-CHIP BONDING STRUCTURE

CROSS-REFERENCE TO RELATED APPLICATION

The present application is a non-provisional application claiming benefit from a US Provisional patent application bearing a Ser. No. 62/787,727 and filed Jan. 2, 2019, contents of which are incorporated herein for reference.

FIELD OF THE INVENTION

The present invention is related to the field of a semiconductor technique, and more specifically, related to a semiconductor chip set with double-sided off-chip bonding structure.

BACKGROUND OF THE INVENTION

Because of the rapid development of semiconductor manufacturing processes, circuit density in a semiconductor chip is increased, and circuitry contained in and functions provided by the semiconductor chips of a unit silicon area are therefore increased. With respect to a memory chip in terms of this trend, the data storage capacity per unit area of the memory is increased. However, a critical point of this rapid development trend has been reached and the density increment of components per unit area of the semiconductor chip during a unit time period is slowed down. In order to keep a high growth trend, many chip-stacking techniques are being developed and provided. However, the availability of the off-chip bonding points of the chips of a stacked semiconductor chip set is an issue. Moreover, the requirement of a low inductance value and a low capacitance value for the power and signal terminals respectively of each of the stacked semiconductor chips cannot be met at the same time with only the through-silicon via (TSV) of which the capacitance is usually high, or with only the bonding wires of which the inductance is usually high.

SUMMARY OF THE INVENTION

In order to overcome the drawbacks described above, a semiconductor chip set and semiconductor chip used therein with double-sided off-chip bonding structure are provided in the disclosure. Off-chip bonding structures provided by the semiconductor chip set could be more than those provided by prior arts such that limitation on the amount of circuits in the semiconductor chip set due to the amount of the off-chip bonding structures is reduced, and the minimum inductance or capacitance values existed between the power/ground or signal terminals of each of the stacked semiconductor chips and the external power/ground or signal terminals of the semiconductor component in which the stacked semiconductor chips are packaged would be further decreased.

In one aspect, the present disclosure provides a semiconductor chip set with double-sided off-chip bonding structure, which is characterized in that at least one first off-chip bonding structure is formed above a first surface of the semiconductor chip set, at least one second off-chip bonding structure is formed above a second surface of the semiconductor chip set, the first surface is opposite to the second surface, and each of the first off-chip bonding structure and the second off-chip bonding structure is used for connecting to an electrical connecting point external to the semiconductor chip set through bonding wire or micro bump.

In one embodiment, the chip circuitry is formed near the first surface and connected to the first off-chip bonding structure.

In one embodiment, the chip circuitry is formed near the first surface and connected to the second off-chip bonding structure through a through-silicon-via set penetrating the semiconductor chip set.

In one embodiment, the semiconductor chip set is a single semiconductor chip, the first surface and the second surface are opposite two surfaces of the single semiconductor chip, and the chip circuitry is formed near the first surface, connected to the first off-chip bonding structure and further connected to the second off-chip bonding structure through a through-silicon-via penetrating the single semiconductor chip.

In one embodiment, the semiconductor chip set further comprises a plurality of semiconductor chips stacked together, wherein the semiconductor chips comprise a first chip and a second chip, a plurality of third off-chip bonding structures are respectively formed above opposite two surfaces of the first chip and opposite two surfaces of the second chip, and the third off-chip bonding structures are used for connecting with circuitry or power terminals external to the stacked semiconductor chips.

In one embodiment, a first control circuit and a first operation circuit electrically connected to the first control circuit are formed in the first chip, a second control circuit and a second operation circuit electrically connected to the second control circuit are formed in the second chip, and the second control circuit is electrically connected to the first operation circuit through a through-silicon-via penetrating the first chip; wherein the first operation circuit is controlled by the first control circuit when the first control circuit is turned on, and the first operation circuit and the second operation circuit are controlled by the second control circuit at the same time when the first control circuit is turned off.

In one embodiment, the semiconductor chip set further comprises a plurality of memory chips stacked together.

In one aspect, the present disclosure provides a semiconductor chip with double-sided off-chip bonding structure, which is characterized in that the semiconductor chip comprises a first surface and a second surface opposite to the first surface, the first surface is adapted to be disposed with a chip circuitry, at least one first off-chip bonding structure is formed above the first surface, at least one second off-chip bonding structure is formed above the second surface, and, at least one of the at least one second off-chip bonding structure is connected to the chip circuitry through a through-silicon-via; wherein, at least one of the at least one first off-chip bonding structure is connected to a first power or a first signal external to the semiconductor chip and at least one of the at least one second off-chip bonding structure is connected to a second power or a second signal external to the semiconductor chip.

In one embodiment, the at least one of the at least one first off-chip bonding structure is connected to the first power or the first signal through a first bonding wire or a first micro bump, and the at least one of the at least one second off-chip bonding structure is connected to the second power or the second signal through a second bonding wire or a second micro bump.

In one aspect, the present disclosure provides a semiconductor chip set comprising a plurality of semiconductor chips, each of the semiconductor chips being as the semiconductor chip recited above, and the semiconductor chips are connected together through connecting a part or all of the at least one first off-chip bonding structure or the at least one second off-chip bonding structure of one of the semiconductor chips to a part or all of the at least one first off-chip bonding structure or the at least one second off-chip bonding structure of another one of the semiconductor chips; wherein, the at least one first off-chip bonding structure or the at least one second off-chip bonding structure of any one of the semiconductor chips is adapted to be connected to receive power external to the semiconductor chip set or is adapted to be connected to communicate signals with elements external to the semiconductor chip set.

Because the off-chip bonding structures are formed above both the front-side (the side/surface near which the chip circuitry is formed) and the back-side (opposite to the front-side) of the semiconductor chip set, the off-chip bonding structures provided by the semiconductor chip or semiconductor chip set recited above could be more than those provided by prior arts. Therefore, limitation on the amount of circuits in the semiconductor chip set due to the amount of the off-chip bonding structures is reduced, and the minimum inductance/capacitance values existed between the power terminal of each of the stacked semiconductor chips and the external power/grounding terminals of the semiconductor component in which the stacked semiconductor chips are packaged would be further decreased.

BRIEF DESCRIPTION OF THE DRAWINGS

In order to make the descriptions of the technique solutions of the embodiments of the present invention or the existed techniques be clearer, the drawings necessary for describing the embodiments or the existed techniques are briefly introduced below. Obviously, the drawings described below are only some embodiments of the present invention, and, for those with ordinary skill in this field, other drawings can be obtained from the drawings described below without creative efforts.

DETAILED DESCRIPTION OF PREFERRED EMBODIMENTS

The technical solutions in the embodiments of the present disclosure are clearly and completely described below with reference to the accompanying drawings in the embodiments of the present disclosure. Obviously, the described embodiments are only a part of the embodiments of the present disclosure, rather than all the embodiments. All other embodiments obtained by persons of ordinary skill in the art based on the embodiments of the present disclosure without creative efforts shall fall within the protection scope of the present application.

Figure 1:
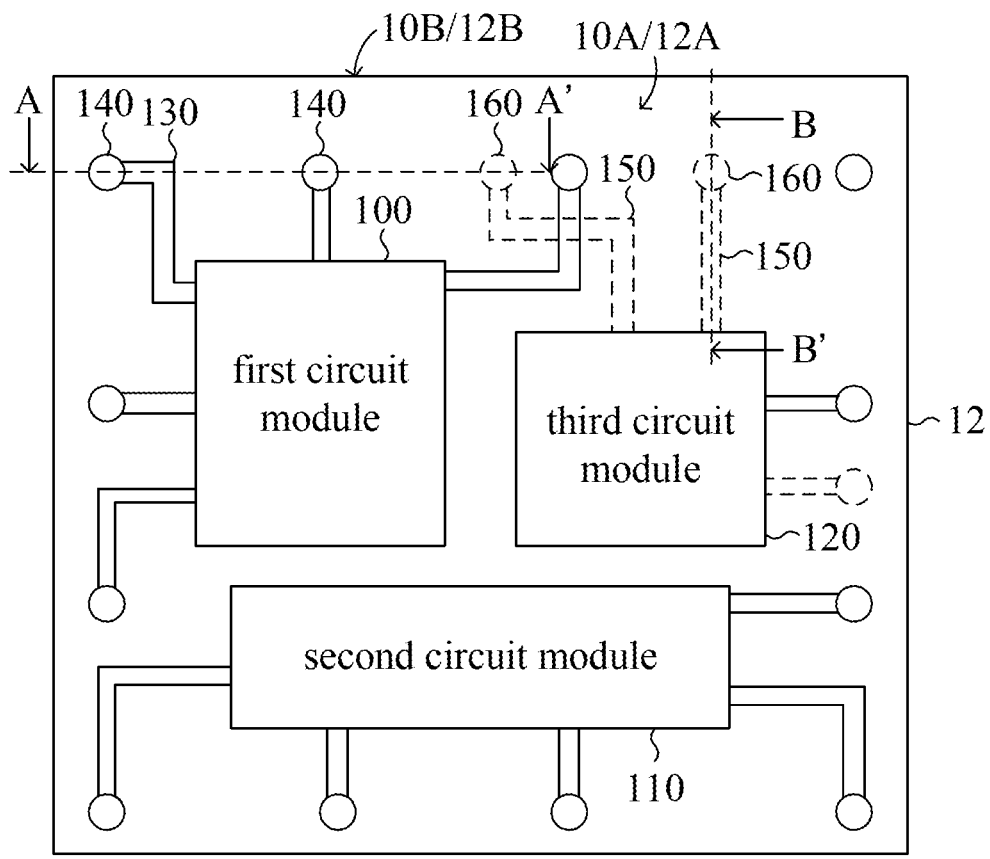
FIG. 1 is a circuitry block diagram of a semiconductor chip set with double-sided off-chip bonding structure according to one embodiment of the present invention.

Please refer to FIG. 1. FIG. 1 is a circuitry block diagram of a semiconductor chip set with double-sided off-chip bonding structure according to one embodiment of the present invention. In the embodiment, the semiconductor chip set 10 comprises a semiconductor 12, and a chip circuitry comprises a first circuit module 100, a second circuit module 110 and a third circuit module 120 is formed near the surface 10A of the semiconductor chip set 10, which equals to the surface 12A of the semiconductor chip 12. A plurality of off-chip bonding structures 140 adapted to be electrically connected to circuitry external to the semiconductor chip set 10 are formed above the surfaces 10A/12A, and a plurality of off-chip bonding structures 160 adapted to be electrically connected to circuitry external to the semiconductor chip set 10 are formed above the surface 10B which equals to the surface 12B of the semiconductor chip 12 and is opposite to the surface 10A/12A. In order to make the drawings be simple and easily understood, not all components in FIG. 1 are labeled. In FIG. 1, the solid-line circles represent the off-chip bonding structures 140 formed above the surface 10A/12A, the dashed-line circles represent the off-chip bonding structures 160 formed above the surface 10B/12B, the solid-line rectangle patterns (conducting structure 130) extent from each of the circuit modules to the off-chip bonding structures 140 represent mediums having electrical connecting property and being formed above the surface 10A/12A, and the dashed-line rectangle patterns (conducting structure 150) extent from each of the circuit modules to the off-chip bonding structures 140 represent mediums having electrical connecting property and being formed above the surface 10B/12B. The first circuit module 100, the second circuit module 110 and the third circuit module 120 are connected to the off-chip bonding structures 140 or off-chip bonding structures 160 respectively so as to receive signals or power from or transmit signals to a circuitry external to the semiconductor chip set 10.

Each circuit module in the chip circuitry could be connected to the off-chip bonding structures 140 or 160, or each circuit module could be connected to the off-chip bonding structures 140 and 160 at the same time. Each circuit module could be directly connected to the off-chip bonding structures 140 or 160, or each circuit module could be electrically connected to the off-chip bonding structures 140 or 160 through the medium having electrical connecting property as shown in FIG. 1. Furthermore, a circuit for transmitting signals between the circuit modules 110, 120 and 130 do not affect the implementation of the present embodiment although there is not a circuit for transmitting signals and being connected between the circuit modules 110, 120 and 130 in the embodiment.

Figure 2:
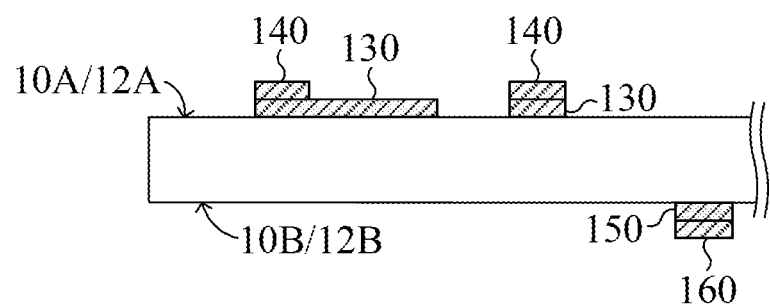
FIG. 2 is a sectional schematic diagram along the line A-A' in the embodiment shown in FIG. 1.
Figure 3:
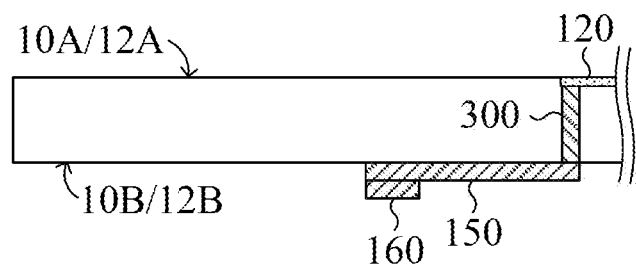
FIG. 3 is a sectional schematic diagram along the line B-B' in the embodiment shown in FIG. 1.

Please refer to FIG. 2, which is a sectional schematic diagram along the line A-A' in the embodiment shown in FIG. 1, it is found from FIG. 2 that the off-chip bonding structure 140 and the conducting structures 130 (for example, a redistribution layer, RDL) is formed above the surface 10A/12A, and the off-chip bonding structures 160 and the conducting structures 150 are formed above the surface 10B/12B. Please also refer to FIG. 3, which is a sectional schematic diagram along the line B-B' in the embodiment shown in FIG. 1, it is found from FIG. 3 that the off-chip bonding structures 160 and the conducting structures 150 are formed above the surface 10B/12B, the third circuit module 120 is buried in the semiconductor chip 12 at a place near the surface 10A/12A, and the third circuit module 120 is electrically connected to the off-chip bonding structure 160 through the through-silicon-via (TSV) 300 and the conducting structure 150. In some embodiments, the off-chip bonding structure 160 could be formed on a terminal of the TSV 300 so that the third circuit module 120 is electrically connected to the off-chip bonding structure 160 through the TSV 300 without using the conducting structure 150.

The techniques described in the embodiments mentioned above can be adapted to a semiconductor chip set composed of only one semiconductor chip, and, furthermore, these techniques can be applied to a semiconductor chip set comprising a plurality of semiconductor chips stacked together in a way described in following embodiments.

Figure 4:
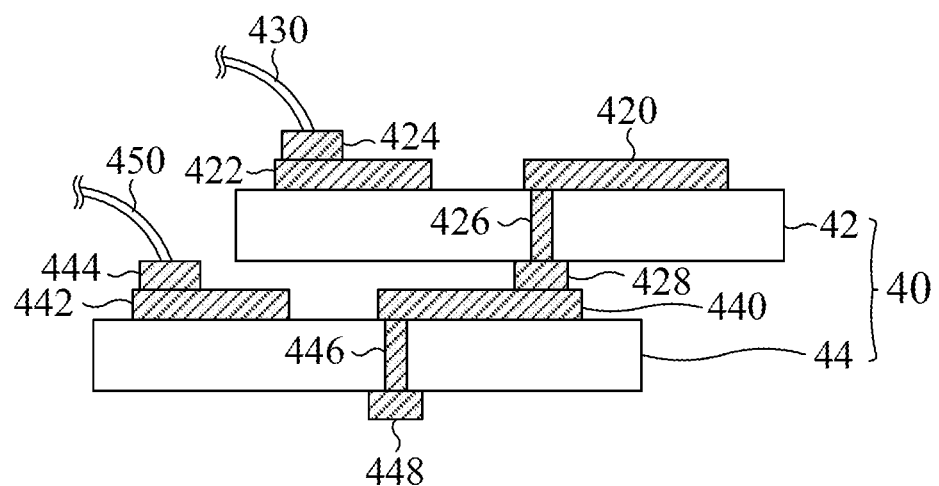
FIG. 4 is a sectional schematic diagram of a semiconductor chip set with double-sided off-chip bonding structure according to one embodiment of the present invention.

Please refer to FIG. 4. FIG. 4 is a sectional schematic diagram of a semiconductor chip set with double-sided off-chip bonding structure according to one embodiment of the present invention. In the embodiment, the semiconductor chip set 40 comprises two semiconductor chips 42 and 44 stacked together. An off-chip bonding structure 424 and an off-chip bonding structure 428 are formed above the two opposite surfaces of the semiconductor chip 42, a conducting structure 420 and a conducting structure 422 are formed above the upper surface of the semiconductor chip 42, and a TSV 426 penetrating the semiconductor chip 42 is formed therein. Besides, an off-chip bonding structure 444 and an off-chip bonding structure 448 are formed above the two opposite surfaces of the semiconductor chip 44, a conducting structure 440 and a conducting structure 442 are formed above the upper surface of the semiconductor chip 44, and a TSV 4426 penetrating the semiconductor chip 44 is formed therein. An internal circuit (not shown) formed near the upper side of the semiconductor chip set 40 is electrically connected to the off-chip bonding structure 448 formed above the lower side of the semiconductor chip set 40 by using the conducting structure 420, the TSV 426, the off-chip bonding structure 428, the conducting structure 440 and the TSV 446, and is further connected to communicate with the circuitry external to the semiconductor chip set 40 through the off-chip bonding structure 448. It is noted that, the internal circuit can be connected to communicate with the circuitry external to the semiconductor chip set 40 through other conducting paths comprising off-chip bonding structures 424 or 444 and corresponded bonding wires 430 and 450.

In the embodiment, the off-chip bonding structures 424, 444 and 448 can be connected to an electrical connecting point external to the semiconductor chip set 40. For example, the off-chip bonding structure 424 is connected to an external bonding point through bonding wire 430, the off-chip bonding structure 444 is connected to an external bonding point through bonding wire 450, and the off-chip bonding structure 448 is connected to an external bonding point through a micro bump. Therefore, an amount of the off-chip bonding structures (i.e., the off-chip bonding structures for connecting to external bonding points) provided on the semiconductor chip set 40 is more than an amount of the off-chip bonding structures provided on the conventional semiconductor chip set. Besides, the off-chip bonding structure 444 are not formed once only the off-chip bonding structures on front-side and back-side of the semiconductor chip set are needed. For example, please refer to FIG. 5, which is a sectional schematic diagram of a semiconductor chip set with double-sided off-chip bonding structure according to one embodiment of the present invention, the semiconductor chip set 50 comprises two semiconductor chips 52 and 54 stacked together wherein the spacer 56 is formed between the semiconductor chips 52 and 54 to prevent the circuits formed in the semiconductor chips 52 and 54 from unexpected electrical connection. In the embodiment, the off-chip bonding structures 540 and 542 are provided above opposite two surfaces of the semiconductor chip 54, off-chip bonding structure 520 is provided only on the surface of the semiconductor chip 52 which equals to the surface at peripheral of the semiconductor chip set 50, and a circuit (not shown) formed in the semiconductor chip 52 is electrically connected to the off-chip bonding structure 542 through the TSV 580 penetrating the semiconductor chip set 50.

In order to provide off-chip bonding structures above opposite two surfaces of the semiconductor chip set comprising at least two stacked semiconductor chips, off-chip bonding structures are provided above one surface of each of the two semiconductor chips farthest apart. For example, in the embodiment illustrated in FIG. 4, in order to provide off-chip bonding structures above opposite two peripheral surfaces of the semiconductor chip set 40, the off-chip bonding structure 424 is formed above the surface of the semiconductor chip 42 farthest apart from the semiconductor chip 44, and the off-chip bonding structure 448 is formed above the surface of the semiconductor chip 44 farthest apart from the semiconductor chip 42. Similarly, in the embodiment illustrated in FIG. 5, in order to provide off-chip bonding structures above opposite two peripheral surfaces of the semiconductor chip set 50, the off-chip bonding structure 520 is formed above the surface of the semiconductor chip 52 farthest apart from the semiconductor chip 54, and the off-chip bonding structure 542 is formed above the surface of the semiconductor chip 54 farthest apart from the semiconductor chip 52.

Figure 5:
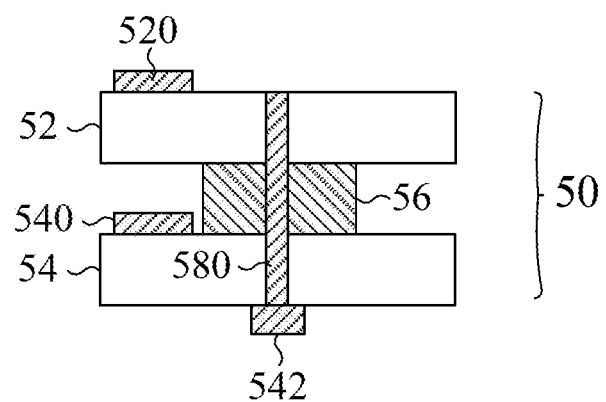
FIG. 5 is a sectional schematic diagram of a semiconductor chip set with double-sided off-chip bonding structure according to one embodiment of the present invention.
Figure 8:
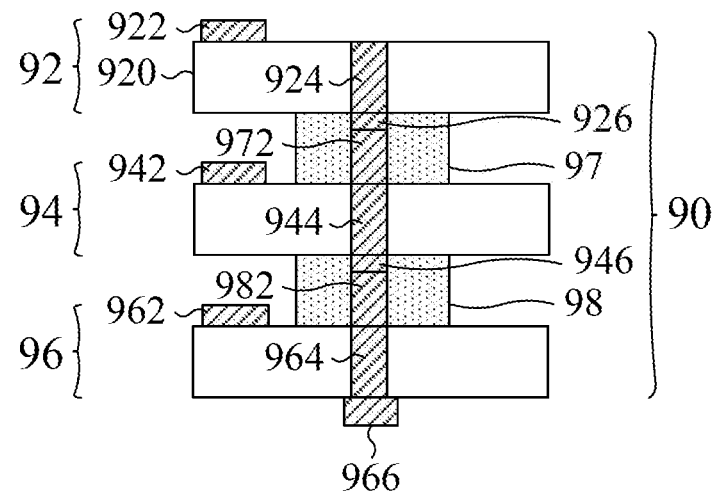
FIG. 8 is a sectional schematic diagram of a semiconductor chip set with double-sided off-chip bonding structure according to one embodiment of the present invention.

It is noted that, when the semiconductor chip set comprises at least two stacked semiconductor chips, the semiconductor chips can be stacked by any reasonable ways besides those shown in FIG. 4 and FIG. 5 without affecting implementation of the present invention. Besides, for reducing complexity of design, the semiconductor chip set can be stacked by a plurality of semiconductor chips having the same off-chip bonding structure patterns. Please refer to FIG. 8, which is a sectional schematic diagram of a semiconductor chip set with double-sided off-chip bonding structure according to one embodiment of the present invention, the semiconductor chip set 90 comprises three semiconductor chips 92, 94 and 96 having the same off-chip bonding structure pattern, wherein the semiconductor chip 92 and semiconductor chip 94 are electrically insulated by the space layer 97, and the semiconductor 94 and the semiconductor 96 are electrically insulated by the space layer 98. As shown in FIG. 8, an off-chip bonding structure 922 is formed on one surface of the semiconductor chip 92, an off-chip bonding structure 926 is formed on another surface of the semiconductor chip 92, and a TSV 924 is formed in the substrate 920 for providing an electrical path connecting a chip circuitry (not shown) formed in the semiconductor chip 92 or other semiconductor chip stacked above the semiconductor chip 92 to the off-chip bonding structure 926. Similarly, an off-chip bonding structure 942 is formed on one surface of the semiconductor chip 94, an off-chip bonding structure 946 is formed on another surface of the semiconductor chip 94, and a TSV 944 is formed in the semiconductor chip 94 for providing an electrical path connecting a chip circuitry (not shown) formed in the semiconductor chip 94 or other semiconductor chip (i.e., the semiconductor chip 92) stacked above the semiconductor chip 94 to the off-chip bonding structure 946; and an off-chip bonding structure 962 is formed on one surface of the semiconductor chip 96, an off-chip bonding structure 966 is formed on another surface of the semiconductor chip 96, and a TSV 964 is formed in the semiconductor chip 96 for providing an electrical path connecting a chip circuitry (not shown) formed in the semiconductor chip 96 or other semiconductor chip (i.e., the semiconductor chip 94) stacked above the semiconductor chip 96 to the off-chip bonding structure 966. The off-chip bonding structure 926 is electrically connected to the TSV 944 through the conducting via 972 penetrating the space layer 97 and the off-chip bonding structure 946 is electrically connected to the TSV 964 through the conducting via 982 penetrating the space layer 98, thereby completing electrical paths connected between the semiconductor chips.

Advantages are obtained by adopting the technique described above, i.e., electrically connecting the stacked semiconductor chips with the TSVs. Please refer to FIG. 6, which is a circuitry block diagram of two chips in a semiconductor chip set with double-sided off-chip bonding structure according to one embodiment of the present invention, the semiconductor chips 72 and 74 are stacked together, wherein the semiconductor chip 72 comprises a first control circuit 720 and a first operation circuit 722, and the semiconductor chip 74 comprises a second control circuit 740 and a second operation circuit 742. The first control circuit 720 provides signals to the first operation circuit 722 to control the operation of the first operation circuit 722, wherein, the signals provided by the first control circuit 720 comprise but are not limited to bias voltage signals, power signals, data signals and control signals. Similarly, the second control circuit 740 provides signals to the second operation circuit 742 to control the operation of the second operation circuit 742, and the second control circuit 740 is electrically connected to the first operation circuit 722 through a TSV penetrating the semiconductor chip 72 (such as the TSVs described in the above embodiments). When the stacked semiconductor chips are normally operated, the first control circuit 720 provides signals to the first operation circuit 722 to control the operation of the first operation circuit 722 and the second control circuit 740 provides signals to the second operation circuit 742 to control the operation of the second operation circuit 742. When the stacked semiconductor chips enter a sleeping status or other status such as the self-refreshing mode of a dynamic random access memory, control circuits of some of the semiconductor chips can be turned off for saving power, and, at this time, the operation circuits of the semiconductor chips of which the control circuits are turned off are controlled by the control circuits kept to be turned on. For example, assuming that the first control circuit 720 is turned off when the semiconductor chip set enters the sleeping status, the operation circuit 722 and the operation circuit 742 can be both controlled by the signals or bias voltages provided by the second control circuit 740.

Figure 6:
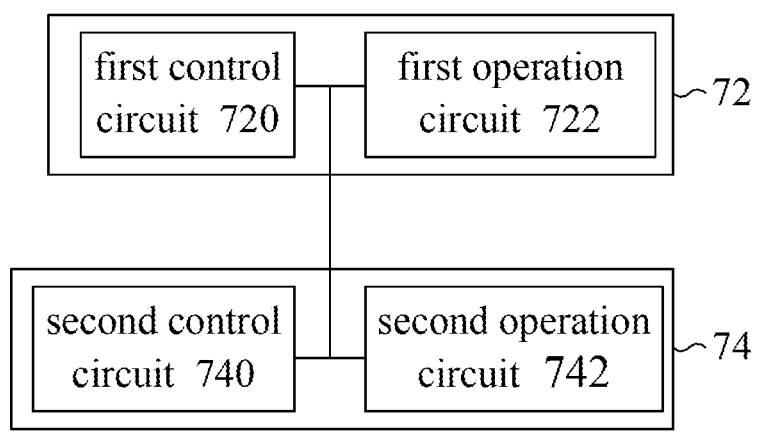
FIG. 6 is a circuitry block diagram of two chips in a semiconductor chip set with double-sided off-chip bonding structure according to one embodiment of the present invention.

In a specific embodiment, when the semiconductor chips 72 and 74 shown in FIG. 6 are memory chips, each of the first control circuit 720 and the second control chip 740 can be a circuit such as a signal generator generating a memory cell self-refreshing frequency signal or other related signals or a power converter, and the first operation circuit 722 and the second operation circuit can be memory cells. Power consumed by the memory chips can be saved by turning off a part or all of the operations made in the first control circuit 720 when the computer is in a sleeping mode or the memory chips are in the self-refreshing mode.

Figure 7:
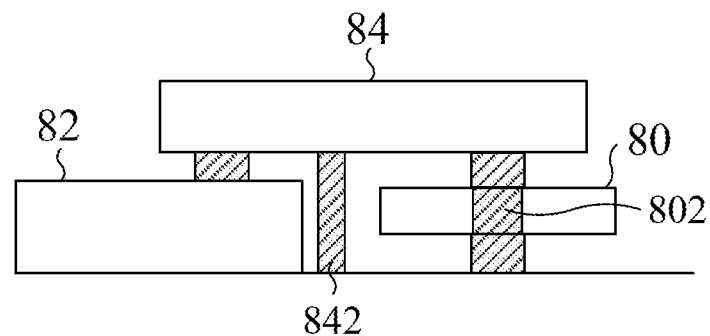
FIG. 7 is a structural schematic diagram shown connection relationship between a semiconductor chip set with double-sided off-chip bonding structure and other semiconductor chip according to one embodiment of the present invention.

Furthermore, circuitry arrangement of an electronic apparatus is more flexible by using the semiconductor chip set with double-sided off-chip bonding structure provided by the present disclosure. For example, please refer to FIG. 7, because a semiconductor chip set 80 with double-sided off-chip bonding structure is used in this embodiment, different semiconductor chip sets 82 and 84 can be connected to and stacked at opposite two sides of the semiconductor chip set 80. Wherein, the off-chip bonding structure on one surface of the semiconductor chip set 80 is directly connected to the off-chip bonding structure of the semiconductor chip set 84, the off-chip bonding structure on another surface of the semiconductor chip set 80 is electrically connected to the semiconductor chip set 82 through the external connection rail of the semiconductor chip set 82. Besides, signals can be transmitted between the semiconductor chip set 80 and the semiconductor chip set 84 and between the semiconductor chip set 80 and the semiconductor chip set 82 by using the off-chip bonding structures on the two surfaces of the semiconductor chip set 80 and the TSV 802. Or, signals can be transmitted between the semiconductor chip set 82 and the semiconductor chip set 84 through the conducting structure 842.

In one embodiment, the specific structure of the semiconductor chip set 80 is formed by at least two stacked semiconductor chips similar to that illustrated in FIG. 4, and, when it is, the connection between the semiconductor chip set 80 and the semiconductor chip set 84 can be made by one or both of the off-chip bonding structure 424 and off-chip bonding structure 444 shown in FIG. 4, or, in addition to the off-chip bonding structures 424 and 444, micro bumps or bonding wires 430 or 450 can be also implemented to accomplish the connection.

Figure 9:
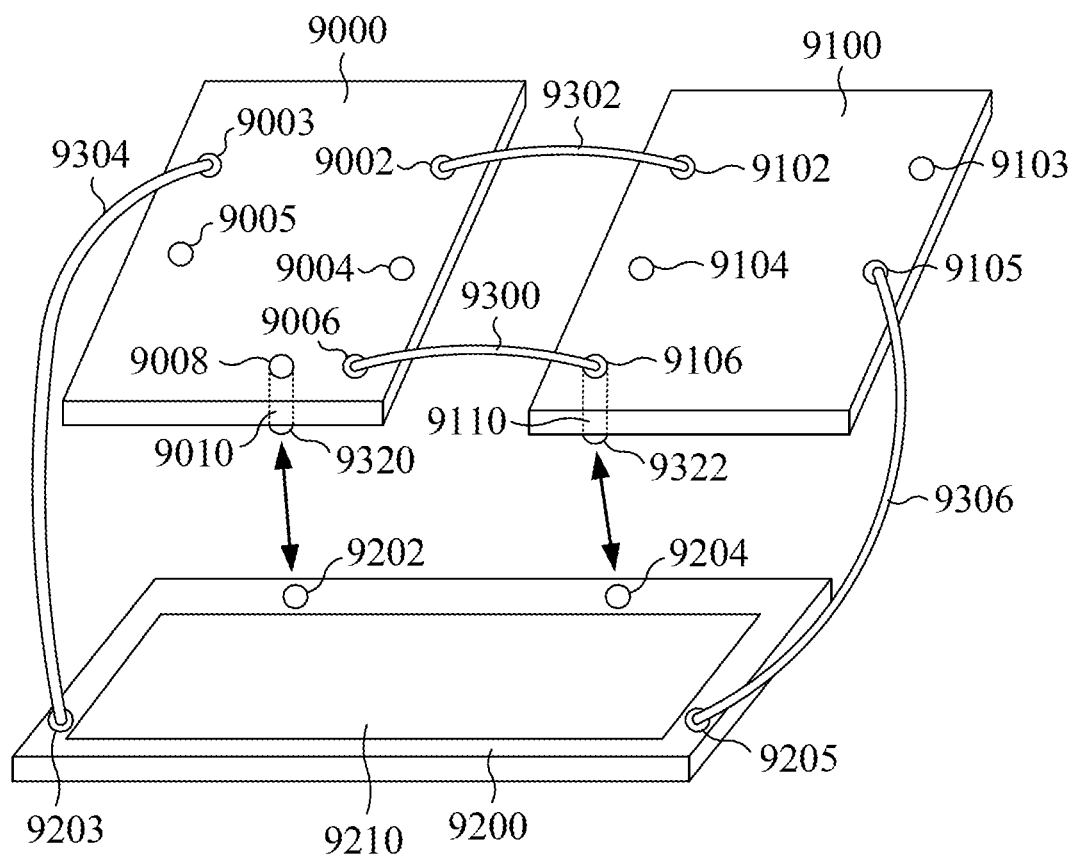
FIG. 9 is a structural schematic diagram of a semiconductor chip set with double-sided off-chip bonding structure according to one embodiment of the present invention.

It is noted that the plurality of the semiconductor chips in a semiconductor chip set can be integrated in other ways as shown in FIG. 9. Please refer to FIG. 9, which is a structural schematic diagram of a semiconductor chip set with double-sided off-chip bonding structure according to one embodiment of the present invention, the semiconductor chip set comprises the semiconductor chips 9000, 9100 and 9200, wherein the off-chip bonding structures 9002, 9003, 9004, 9005, 9006 and 9008 are formed on the semiconductor chip 9000, the off-chip bonding structures 9102, 9103, 9104, 9105 and 9106 are formed on the semiconductor chip 9100, and the off-chip bonding structures 9202, 9203, 9204 and 9205 and the circuit module 9210 are formed on the semiconductor chip 9200. Any one of the off-chip bonding structures formed on the semiconductor chips 9000, 9100 and 9200 could be adapted to be connected to a circuitry external to the semiconductor chip set for communicating power or signal, and electrical connection relationship between the semiconductor chips 9000, 9100 and 9200 can be established by using these off-chip bonding structures and appropriate mediums having electrical connecting property. For example, an electrical connection between the off-chip bonding structure 9002 and the off-chip bonding structure 9102 is established by using the bonding wire 9302; an electrical connection between the off-chip bonding structure 9008 and the off-chip bonding structure 9202 is established by using the TSV 9010 and the micro bump 9320 directly connected to the off-chip bonding structure 9202; an electrical connection between the off-chip bonding structure 9006 and the off-chip bonding structure 9106 is established by using the bonding wire 9300, and an electrical connection between the off-chip bonding structure 9106 and the off-chip bonding structure 9204 is further established by using the TSV 9110 and the micro bump 9322 directly connected to the off-chip bonding structure 9204; an electrical connection between the off-chip bonding structure 9003 and the off-chip bonding structure 9203 is established by using the bonding wire 9304; and an electrical connection between the off-chip bonding structure 9105 and the off-chip bonding structure 9205 is established by using the bonding wire 9306. It is understood that the bonding wires 9300, 9302 and 9304 can be replaced by any other electrical conducting means.

It is noted that one or more circuit modules can be formed with each of the semiconductor chips 9000, 9100 and 9200, and these circuit modules may be electrically connected to the off-chip bonding structures. In order to make the drawings be simple and easily understood, only a part of the off-chip bonding structures and circuit modules are illustrated in FIG. 9, and, therefore, only a part of electrical connection is illustrated in FIG. 9, too.

It is noted that, the off-chip bonding structures in the embodiments described above can be connected to circuits external to the semiconductor chip set by using bonding wires or micro bumps or any other mediums with appropriate types.

In summary, because the off-chip bonding structures are formed with the front-side (the side/surface near which the chip circuitry is formed) and the back-side (opposite to the front-side) of the semiconductor chip set, the off-chip bonding structures provided by the semiconductor chip or semiconductor chip set can be more than those provided by prior arts. Therefore, limitation of circuits in the semiconductor chip set due to the limitation of the number of off-chip bonding structures is reduced, and the minimum inductance/capacitance values existed between the power terminal of each of the stacked semiconductor chips and the external power/grounding terminals of the semiconductor component in which the stacked semiconductor chips are packaged would be further decreased. Furthermore, design of connections between the semiconductor chip sets is more flexible such that a volume of the whole electronic apparatus is probably decreased. It is understood that, while packaging the semiconductor chips as a packaged I.C. (Integrated Circuit), a substrate must be provided as a package substrate of the packaged I.C. to stack the semiconductor chips together. In the embodiment shown in FIG. 9, any one of the semiconductor chips 9100, 9200 and 9300 can be replaced by the package substrate, and, after packaging the semiconductor chips into the packaged I.C., the goal of reducing the minimum inductance/capacitance values existed between the power terminal of each of the stacked semiconductor chips and the external power/grounding terminals of the semiconductor component in which the stacked semiconductor chips are packaged can be reached by the connection structure shown in the embodiments described above.

The foregoing contents are detailed description of the disclosure in conjunction with specific preferred embodiments and concrete embodiments of the disclosure are not limited to the description. For the person skilled in the art of the disclosure, without departing from the concept of the disclosure, simple deductions or substitutions can be made and should be included in the protection scope of the application.

What is claimed is:

1. A semiconductor chip set with double-sided off-chip bonding structure, which is characterized in comprising a first off-chip bonding structure which is formed above a first surface of the semiconductor chip set, and a second off-chip bonding structure which is formed above a second surface of the semiconductor chip set, wherein each of the off-chip bonding structures above the first surface and second surface of the semiconductor chip set can be used for connecting to a signal or power connecting point external to the semiconductor chip set through bonding wire, through-silicon via (TSV) or micro bump in the semiconductor chip set, and, when the first off-chip bonding structure and the second off-chip bonding structure are connected to a same substrate providing the signal or power connecting points, a first point formed on the same substrate and connected to the first off-chip bonding structure is different from a second point formed on the same substrate and connected to the second off-chip bonding structure.

2. The semiconductor chip set according to claim 1, wherein a chip circuitry is formed near the first surface and connected to the first off-chip bonding structure.

3. The semiconductor chip set according to claim 1, wherein a chip circuitry is formed near the first surface and connected to the second off-chip bonding structure through a through-silicon-via set penetrating the semiconductor chip set.

4. The semiconductor chip set according to claim 1, wherein the semiconductor chip set is a single semiconductor chip, the first surface and the second surface are opposite two surfaces of the single semiconductor chip, and a chip circuitry is formed near the first surface, connected to the first off-chip bonding structure and further connected to the second off-chip bonding structure through a through-silicon-via penetrating the single semiconductor chip.

5. The semiconductor chip set according to claim 1, further comprising a plurality of semiconductor chips stacked together, wherein the semiconductor chips comprise a first chip and a second chip, a plurality of third bonding structures are respectively formed above opposite two surfaces of the first chip and formed above opposite two surfaces of the second chip, and the third bonding structures are used for connecting with signal or power terminals external to the stacked semiconductor chips.

6. The semiconductor chip set according to claim 5, wherein a first control circuit and a first operation circuit electrically connected to the first control circuit are arranged in the first chip, a second control circuit and a second operation circuit electrically connected to the second control circuit are arranged in the second chip, and the second control circuit is electrically connected to the first operation circuit through a through-silicon-via penetrating the first chip;

wherein the first operation circuit is controlled by the first control circuit when the first control circuit is turned on, and the first operation circuit and the second operation circuit are controlled by the second control circuit at the same time when the first control circuit is turned off.

7. The semiconductor chip set according to claim 1, further comprising a plurality of memory chips stacked together.

8. A semiconductor chip with double-sided off-chip bonding structure, which is characterized in that the semiconductor chip comprises a first surface and a second surface opposite to the first surface, the first surface is adapted to be disposed with a chip circuitry, at least one first off-chip bonding structure is formed above the first surface, at least one a second off-chip bonding structure is formed above the second surface, and, at least one of the at least one second off-chip bonding structure is connected to the chip circuitry through a through-silicon-via;

wherein, at least one of the at least one first off-chip bonding structure is connected to a first power or a first signal external to the semiconductor chip, at least one of the at least one second off-chip bonding structure is connected to a second power or a second signal external to the semiconductor chip, and, when the at least one first off-chip bonding structure and the at least one second off-chip bonding structure are connected to a same substrate, a first point formed on the same substrate and connected to the at least one first off-chip bonding structure is different from a second point formed on the same substrate and connected to the at least one second off-chip bonding structure.

9. The semiconductor chip according to claim 8, wherein the at least one of the at least one first off-chip bonding structure is connected to the first power or the first signal through a first bonding wire or a first micro bump, and the at least one of the at least one second off-chip bonding structure is connected to the second power or the second signal through a second bonding wire or a second micro bump.

10. A semiconductor chip set, comprising a plurality of semiconductor chips, each of the semiconductor chips being as the semiconductor chip recited in claim 8, and the semiconductor chips are connected together through connecting a part or all of the at least one first off-chip bonding structure or the at least one second off-chip bonding structure of one of the semiconductor chips to a part or all of the at least one first off-chip bonding structure or the at least one second off-chip bonding structure of another one of the semiconductor chips;

wherein, the at least one first off-chip bonding structure or the at least one second off-chip bonding structure of any one of the semiconductor chips is adapted to be connected to receive power external to the semiconductor chip set or is adapted to be connected to communicate signals with elements external to the semiconductor chip set.

\* \* \* \* \*